United States Patent
Quelen

(10) Patent No.: US 11,451,158 B2
(45) Date of Patent: Sep. 20, 2022

(54) ELECTRONIC INTERFACE FOR ELECTROMAGNETIC ENERGY RECUPERATION

(71) Applicant: COMMISSARIAT A L'ENERGIE ATOMIQUE ET AUX ENERGIES ALTERNATIVES, Paris (FR)

(72) Inventor: Antony Quelen, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 367 days.

(21) Appl. No.: 16/743,046

(22) Filed: Jan. 15, 2020

(65) Prior Publication Data
US 2020/0228026 A1    Jul. 16, 2020

(30) Foreign Application Priority Data
Jan. 16, 2019   (FR) ...................................... 19 00375

(51) Int. Cl.
| | |
|---|---|
| H02M 7/217 | (2006.01) |
| H02J 50/00 | (2016.01) |
| H02J 7/04 | (2006.01) |
| H03K 17/94 | (2006.01) |

(52) U.S. Cl.
CPC .............. *H02M 7/217* (2013.01); *H02J 7/04* (2013.01); *H02J 50/001* (2020.01); *H03K 17/94* (2013.01)

(58) Field of Classification Search
CPC .... H02M 7/217; H02M 3/1582; H02J 50/001; H02J 7/04; H02J 7/0024; H02J 1/10; H02J 7/0016; H03K 17/94
USPC .................................................. 320/107, 117
See application file for complete search history.

(56) References Cited

U.S. PATENT DOCUMENTS

| | | | | |
|---|---|---|---|---|
| 9,197,143 | B1* | 11/2015 | Townsend | H02J 50/001 |
| 2012/0086285 | A1* | 4/2012 | Hyoung | H02J 50/00 |
| | | | | 307/104 |
| 2016/0336794 | A1* | 11/2016 | Hsu | H02J 7/34 |
| 2017/0199229 | A1* | 7/2017 | King | H02J 5/005 |
| 2018/0366981 | A1* | 12/2018 | Liao | H02M 7/53846 |
| 2019/0386504 | A1* | 12/2019 | Yao | H02J 13/00032 |
| 2021/0044004 | A1* | 2/2021 | Bean | H02J 50/001 |
| 2021/0152035 | A1* | 5/2021 | Smith | H02J 50/10 |
| 2021/0194359 | A1* | 6/2021 | Qu | H02M 3/155 |
| 2021/0336481 | A1* | 10/2021 | Sung | H02J 50/10 |
| 2021/0356417 | A1* | 11/2021 | Babakhani | H02J 50/80 |

(Continued)

FOREIGN PATENT DOCUMENTS

| | | | | | |
|---|---|---|---|---|---|
| EP | 3312773 | A1 * | 4/2018 | ......... | G06K 19/0709 |
| EP | 3843255 | A1 * | 6/2021 | ............ | H02J 50/001 |

(Continued)

OTHER PUBLICATIONS

French Preliminary Search Report dated Oct. 8, 2019 in French Application 19 00375 filed Jan. 16, 2019 (with English Translation of Categories of Cited Documents), 2 pages.

(Continued)

*Primary Examiner* — Suresh Memula
(74) *Attorney, Agent, or Firm* — Oblon, McClelland, Maier & Neustadt, L.L.P.

(57) ABSTRACT

An electronic interface device between an electromagnetic energy harvesting stage provided with an inductance and a load stage, the electronic interface device being provided to allow tending the charge seen by the harvesting stage towards an optimal charge and thus being able to extract a maximum of energy from this energy harvesting stage.

16 Claims, 9 Drawing Sheets

(56) References Cited

U.S. PATENT DOCUMENTS

| | | | |
|---|---|---|---|
| 2022/0029464 A1* | 1/2022 | Smith | G06F 21/44 |
| 2022/0037920 A1* | 2/2022 | Yudanov | G11C 11/221 |
| 2022/0045554 A1* | 2/2022 | Leabman | A61B 8/56 |

FOREIGN PATENT DOCUMENTS

| | | | | |
|---|---|---|---|---|
| WO | WO-2012015942 A1 * | 2/2012 | | H02J 5/005 |
| WO | WO-2012092209 A2 * | 7/2012 | | F03G 5/06 |
| WO | WO-2021055901 A * | 3/2021 | | H02J 50/23 |

OTHER PUBLICATIONS

Chen, N. et al., "A piezoelectric impact-induced vibration cantilever energy harvester from speed bump with a low-power power management circuit," Sensors and Actuators A 254, 2017, pp. 134-144.

Szarka, G. D. et al., "Ultralow Power, Fully Autonomous Boost Rectifier for Electromagnetic Energy Harvesters," IEEE Transactions on Power Electronics, vol. 28, No. 7, Jul. 2013, pp. 3353-3362.

Szarka, G. D. et al., "Experimental Investigation of Inductorless, Single-Stage Boost Rectification for sub-mW Electromagnetic Energy Harvesters," Proceedings of the International Symposium on Low Power Electronics and Design, 2011, pp. 361-366.

Dayal, R. et al., "A New Design for Vibration-Based Electromagnetic Energy Harvesting Systems Using Coil Inductance of Microgenerator," IEEE Transactions on Industry Applications, vol. 47, No. 2, Mar./Apr. 2011, pp. 820-830.

Sanchez, D. A., "A Parallel-SSHI Rectifier for Piezoelectric Energy Harvesting of Periodic and Shock Excitations," IEEE Journal of Solid-State Circuits, Vo. 51, No. 12, Dec. 2016, pp. 2867-2879.

Goravanchi, P. et al., "On-Chip AC/DC Converter With No-Load Over-Voltage Protection and Output Ripple Reduction," 2013 IEEE 18th International Workshop on Computer Aided Modeling and Design of Communication Links and Networks (CAMAD), 2013, pp. 124-128.

Leicht, J. et al., "A 2.6 µW-1.2 mW Autonomous Electromagnetic Vibration Energy Harvester Interface IC with Conduction-Angle-Controlled MPPT and up to 95% Efficiency,"IEEE Journal of Solid-State Circuits, vol. 52, No. 9, Sep. 2017, pp. 2448-2462.

* cited by examiner

ELECTRONIC INTERFACE FOR ELECTROMAGNETIC ENERGY RECUPERATION

TECHNICAL FIELD AND PRIOR ART

The present application relates to the field of the electromagnetic energy harvesting and in particular finds applications in systems called "autonomous" energy systems such as wireless switches.

More particularly it aims an electronic interface architecture between an electromagnetic energy harvesting stage intended to produce an AC signal and a load stage provided with a means allowing to store this energy from a DC signal.

An example of a conventional circuit 20 interfacing between an electromagnetic energy harvesting stage 10 and a load stage 30 in a wireless switch system is given in FIG. 1. The load stage 30 is formed here with a capacitance 31 associated with an RF emitter 35.

The interface circuit 20 is provided with an AC/DC converter formed by four transistors 21, 22, 23, 24, arranged in a bridge, and which allows rectifying an alternating current into a direct current. At the output of the converter 20, a diode 25 is typically provided to prevent the current from returning to the energy harvesting stage 10.

Such a circuit has the advantage of being inexpensive to implement but has an energy yield at the output, in the example illustrated on a node with a potential $V_{TANK}$ of the order of 50% to 55% and which is sought to be improved.

In order to increase the amount of electrical energy extracted from the energy harvester while minimising losses from the AC/DC converter, one could consider using an interface circuit of the "buck-boost" type and similar to that described in the document "*A piezoelectric impact-induced vibration cantilever energy harvester from speed bump with a low-power management circuit*", by Chen and al., sensors and actuators A254 (2017), provided however in this document for a piezoelectric energy harvesting. This type of circuit uses in particular an external inductance which makes it expensive.

There arises the problem of making a new interface circuit between an electromagnetic energy harvesting stage and a load stage, which has an improved energy yield and a reduced cost.

DESCRIPTION OF THE INVENTION

An embodiment of the present invention provides an electronic interface circuit between an electromagnetic energy harvesting stage and a load stage, the electromagnetic energy harvesting stage comprising an inductance and being capable of producing an alternating AC signal resulting from a conversion of mechanical energy into electromagnetic energy, the load stage being provided with a means for storing electrical charges, particularly a capacitance, the electronic interface circuit comprising:

an AC/DC converter for converting an input signal between a first terminal and a second terminal connected at the output of said harvesting stage, and producing a DC signal at the input of said load stage, the converter being provided with a rectifier for supplying a rectified signal to said means for storing electrical charges, the interface circuit further comprising:

a first switch, arranged between the first terminal and the second terminal and capable of alternately connecting or disconnecting the first terminal and the second terminal from one another, the closed or open state of the first switch being governed by a first command signal $V_{MS}$;

a second switch, disposed between an output of the rectifier and the load stage and capable of alternately connecting or disconnecting the output of the rectifier from said load stage, the open or closed state of the second switch being governed by a second command signal $V_{SR}$, the electronic interface circuit being further provided:

with a logic control block configured to produce said first command signal $V_{MS}$ and said second command signal $V_{SR}$, said control block being capable of alternately switching said switches from a first configuration to a second configuration and from the second to the first configuration, the first configuration being a configuration wherein the first switch is open and the second switch is closed, so that said first terminal and said second terminal are disconnected and the output of said rectifier is connected to said means for storing electrical charges, the second configuration being a configuration wherein the first switch is closed and the second switch is open so as to disconnect the output of the rectifier from said load stage and connect the first terminal and the second terminal to each other.

The interface circuit thus alternates different configurations allowing respectively performing charging and discharging phases of the inductance, without using an external inductance or an inductance connected between the input terminals thereof.

These different configurations allow performing a dual-mode operation with a first mode called "linear" mode and a second mode called "boost" mode, the linear mode uses said first configuration of the switches, while the "boost" mode alternately uses the first configuration and the second configuration. In the operating mode called "boost" operating mode, the control block typically triggers an alternation or a switching between said first configuration and said second configuration several times.

With such a circuit and such an operating mode, the energy yield is improved while limiting the cost of the components.

Typically the electromagnetic energy harvesting stage has for equivalent electrical circuit an alternating voltage generator, an inductance L and an output impedance Rs, the generator producing an alternating AC signal resulting from a conversion of mechanical energy into electromagnetic energy.

The electronic interface circuit may particularly further comprise an operating mode detection stage provided with a comparator for comparing an output voltage $V_{OUT}$ applied to said charge storage means with a voltage equal to a product $R_{min}*I_{sense}$ of a current $I_{sense}$ supplied at the output of said rectifier and capable of being injected into said charge storage means by a resistance $R_{min}$ of a predetermined value depending on the output impedance value $R_s$ of said electromagnetic energy harvesting stage, and generating when this product $R_{min}*I_{sense}$ is less than the output voltage $V_{OUT}$, a trigger signal $V_{boost}$ to said logic control block and capable of triggering a switching from the first configuration to said second configuration from the first mode to the second mode.

The circuit is then in the operating mode called "boost" operating mode wherein the circuit is then capable of alternating one or more phase(s) in said first configuration and one or more phase(s) in said second configuration.

The value $R_{min}$ depends on the type of harvester and is therefore adapted according to the electromagnetic energy harvesting stage used and the optimal impedance $R_{opt}$ thereof.

Such an operating mode allows harvesting energy particularly on the alternations of the signal supplied by the harvester by optimising the impedance seen by the harvester.

Advantageously, the resistance $R_{min}$ is such that:

$R_{min}=K1*R_s=K2*R_{opt}$, with K2<K1. The coefficients K1 and K2 depend on the type of electromagnetic energy harvesting stage used. The second command signal $V_{SR}$ can be a logic signal, the logic state of which depends on that of a first configuration indicator signal $T_{OFF}$ produced by said logic control block.

The first command signal $V_{MS}$ can also be a logic signal, the state of which depends on that of a second configuration indicator signal $T_{ON}$ produced by said logic control block and complementary to the first configuration indicator signal $T_{OFF}$.

The control block can be further configured to modify said second logic configuration indicator signal $T_{ON}$ subsequently to a reception of said trigger signal $V_{boost}$, the phase(s) in said second configuration then having a fixed duration D_TON at the end of which said control block automatically modifies the second configuration indicator signal $T_{ON}$.

The phase(s) in said first configuration in turn have a predetermined maximum duration D_TOFFmax controlled by said control block and provided at most equal to the fixed duration D_TON.

The fixed duration D_TON of the phase(s) in the second configuration and the predetermined maximum duration D_TOFFmax of the phase(s) in the first configuration can be such that: $L/2R_s \leq D\_TON \leq L/R_s$.

The choice of the precise value of D_TON depends on the type of harvester or electromagnetic harvesting stage used and in the case where this stage allows for example translating a mechanical acceleration into an electromagnetic signal, on the acceleration undergone by the harvester.

As an example, for a particular harvester of a particular wireless switch system, $D\_TON=(4*L)/(7*R_s)D\_TOFFmax$ can be selected.

The duration of different configurations is thus provided so as to place the device in optimal impedance conditions seen by the harvester.

According to one embodiment, the interface circuit can also be provided with a first duration lapse indicator block, configured, after a change of state of said second configuration indicator signal $T_{ON}$, to generate after a predetermined delay equal to said fixed duration D_TON, a signal $T_{OND}$ indicating the duration lapse of the second configuration to the control block so as to trigger a new change of state of said second configuration indicator signal $T_{ON}$.

According to one embodiment, the interface circuit can also be provided with a second duration lapse indicator block for, after a change of state of said first configuration indicator signal $T_{OFF}$, generating after a predetermined delay, a signal $T_{OFFD}$ of maximum duration D_TOFFmax lapse of the first configuration to the control block capable of triggering a new change of state of the first configuration indicator signal $T_{OFF}$.

Advantageously, the interface circuit can also comprise: a minimum current detection stage, particularly provided with a current comparator, for detecting a current $I_{SENSE}$ capable of being supplied at the input of said load stage and being injected into said charge storage means $C_{tank}$ and when said current supplied at the input of said load stage falls below a threshold $I_{refmin}$, consequently generating a minimum current detection signal $V_{IMIN}$ to the control block capable of triggering a change of configuration from the first configuration to the second configuration.

According to one embodiment of the interface circuit, the latter can also be further provided with a stage for detecting a minimum output voltage value, particularly provided with a threshold detector, configured to detect a passage of the output voltage $V_{OUT}$ applied to the means for storing electrical charges above a threshold value and modify, when this detection is carried out, a logic state from a first state to a second state of a threshold detection signal $V_{por}$ to the logic control block, said control block being configured to condition the triggering of a switching from the first configuration to the second configuration upon said state modification of said threshold detection signal $V_{por}$.

Advantageously, said control block is also configured to trigger a switching from the second configuration to the first configuration subsequently to a change of state, from the second state to the first state, of said threshold detection signal $V_{por}$.

According to a particular embodiment of the interface circuit, the latter can also be provided with another detection stage provided with a comparator, configured to compare the output voltage $V_{OUT}$ applied to the means for storing electrical charges and the voltage $V_{NVC}$ at the output of the rectifier, and produce a comparison signal a given state of which indicates whether the voltage $V_{NVC}$ at the output of the rectifier is greater than the output voltage $V_{OUT}$ applied to the storage means, the control block being configured to condition the closing of the first switch to a switching to the given state of said comparison signal $V_{up}$.

According to an advantageous embodiment of the interface circuit, the latter can further comprise a stage for detecting overvoltages of said voltage $V_{OUT}$ at the terminals of said charge storage means $C_{tank}$, the overvoltage detection stage being provided with a comparator configured to compare said voltage $V_{OUT}$ at the terminals of said charge storage means with a predetermined threshold voltage $V_{OVTH}$, and produce an overvoltage detection signal $V_{ov}$ when the predetermined threshold voltage is exceeded, the control block being configured, subsequently to the reception of said overvoltage detection signal $V_{ov}$, to trigger a change of state of said second command signal $V_{SR}$ so as to open the second switch, the reception of said overvoltage detection signal $V_{ov}$ being further capable of triggering a change of state of said first command signal $V_{MS}$ so as to close the first switch.

Advantageously, the second switch can comprise a transistor with source and drain regions extending in a region called bulk region, the device further comprising a bulk potential selection circuit configured, subsequently to the reception of said overvoltage detection signal, to select a given potential, the highest between a voltage $V_{NVC}$ at the output of the rectifier applied to a terminal of said discharge transistor and said output voltage $V_{OUT}$ at the terminals of said charge storage means, and apply the selected given potential to said bulk region of said transistor.

Typically, in the first configuration the first terminal and the second terminal are connected directly to each other by the first switch.

Thus, the first switch can advantageously be formed of a transistor including an electrode directly connected to said first terminal and an electrode directly connected to the second terminal. The interface circuit is thus advantageously free, between the input terminals thereof, of an inductance or capacitance-type additional component.

According to a particular embodiment, the load stage can be provided with an RF emitter associated with the charge storage means and provided to emit an RF signal according to the filling of said means for storing electrical charges. This is in particular the case when the harvesting stage and the electronic interface circuit are part of a wireless switch system.

Thus, according to a particular aspect, the present invention relates to a wireless switch system, comprising:
- an electromagnetic energy harvesting stage,
- an electronic interface circuit according to one of the preceding claims arranged at the output of the electromagnetic energy harvesting stage,
- a load stage at the output of said electronic interface circuit, the load stage being provided with a means for storing electrical charges and with an RF emitter provided for emitting an RF signal according to the filling of said means for storing electrical charges.

BRIEF DESCRIPTION OF THE DRAWINGS

The present invention will be better understood upon reading the description of exemplary embodiments given, in a purely indicative and in non-limiting manner, with reference to the appended drawings wherein.

Identical, similar or equivalent parts of the different figures have the same reference numerals so as to facilitate the passage from one figure to another.

The different parts shown in the figures are not necessarily shown on a uniform scale, to make the figures more readable.

DETAILED DESCRIPTION OF PARTICULAR EMBODIMENTS

An electronic interface circuit for an autonomous electrical energy system will now be described in connection with FIG. 2.

The system comprises a first electromagnetic energy harvesting stage 110 which is intended to produce an alternating electrical AC signal. This electromagnetic energy typically results from an energy conversion following a mechanical excitation. The electromagnetic energy harvesting stage comprises an inductance, that is to say provided with at least one component intended by its construction to have a certain value of inductance and/or to be able to be modelled by means of an element provided with an inductance. According to a particular exemplary embodiment, may belong to a wireless switch system. The mechanical excitation may in this case be generated by a pressure exerted on a button of the switch.

Figure 2:
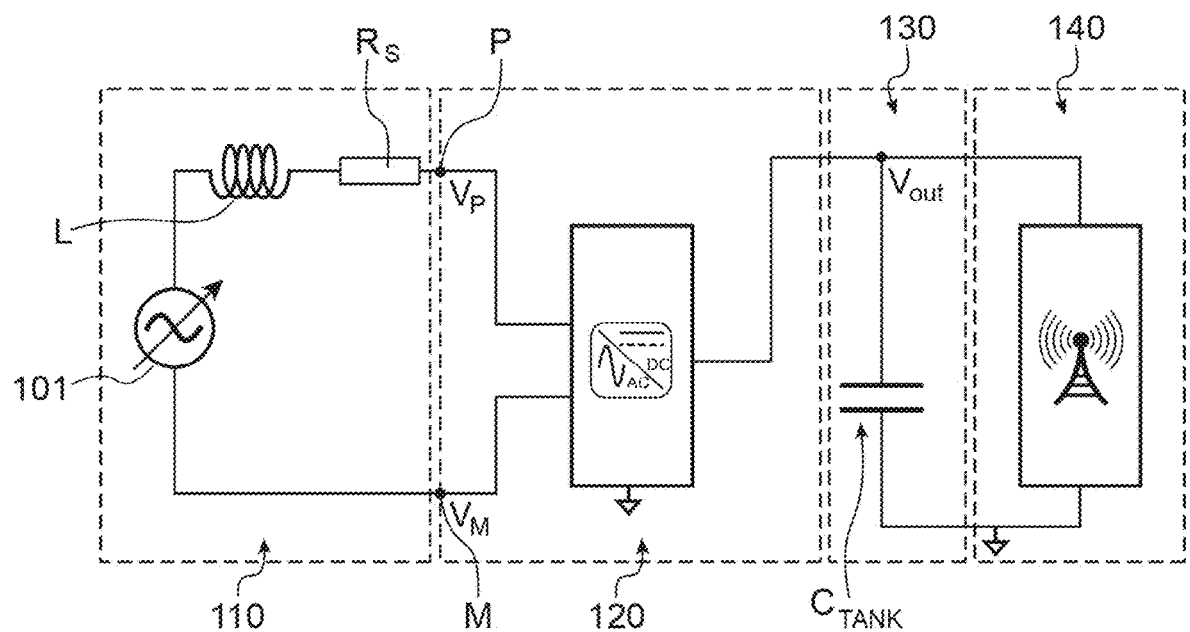
FIG. 2 serves to illustrate an example of a system, according to an embodiment of the present invention, comprising a particular electronic circuit of interface between an electromagnetic energy harvesting stage and an energy storage means associated with an RF emitter, the electronic interface device being adapted so as to be able to adopt several operating modes so as to improve the energy extraction efficiency of the harvesting stage while minimising the losses of the AC/DC conversion implemented by this device.
Figure 3:
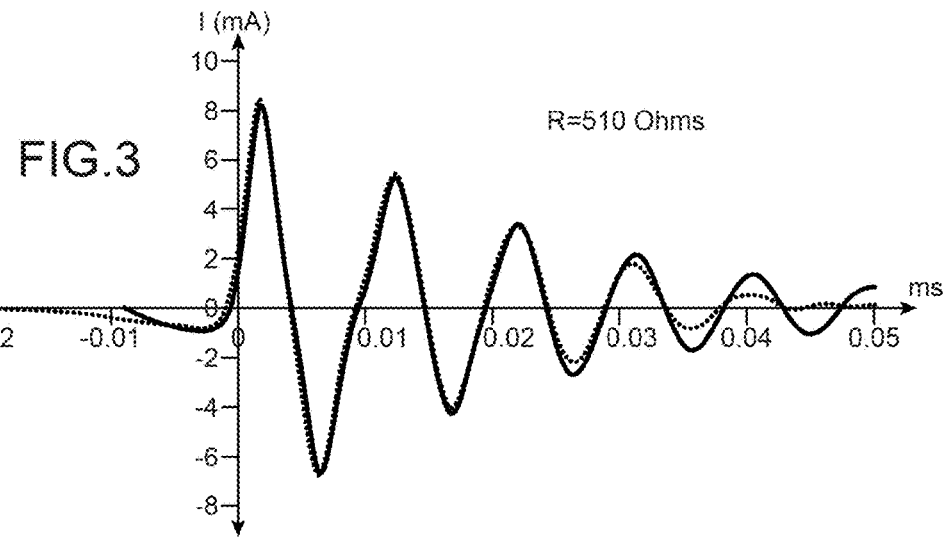
FIG. 3 serves to illustrate an example of a signal simulation supplied by the electromagnetic energy harvesting stage when the impedance seen by the latter is optimal.

An equivalent electrical circuit of the electromagnetic energy harvesting stage 110 is schematically shown in FIG. 2, with an alternating voltage generator 101, an inductance L, and an output impedance Rs.

The alternating AC signal produced by this stage 110 is transmitted to the input terminals P, M of an electronic interface circuit 120 as implemented according to an embodiment of the present invention and configured to convert this alternating AC signal into a DC signal that can be exploited by a load stage particularly provided with a means 130 for storing electrical energy. In the illustrated example, the means 130 for storing electrical energy comprises a capacitance $C_{tank}$.

The shape of the AC signal supplied by the electromagnetic energy harvesting stage 110 in terms of frequency and amplitude reflects that of the excitation. The alternating AC signal at the input of the interface circuit 120 is thus typically formed of a succession of oscillations. In particular in the context of an application to a wireless switch, these oscillations are typically decreasing.

A particular example of shape of the alternating AC signal capable of being supplied at the output of the first stage 110 is given in FIG. 2, when said first stage sees an optimal charge $R_{opt}$ at the output. Here the optimal charge $R_{opt}$ is evaluated at a resistance of the order of $K*R_s$, with for a particular exemplary embodiment associated with a particular type of harvester: K=2. Under optimal charge condition, the energy extracted from the harvester 110 is then maximum. The electronic interface circuit 120 implemented according to the invention is designed to allow tending towards this optimal charge $R_{opt}$ and being able to extract a maximum of energy from the energy harvesting stage 110.

In the illustrated exemplary embodiment, the capacitance $C_{tank}$ is associated with an emitter 140 of electromagnetic waves, in particular RF waves. This RF emitter 140 can thus be configured to emit an RF signal according to the filling of said storage means 130 indicated by an output voltage $V_{OUT}$ at the terminals of the capacitance $C_{tank}$.

The output voltage $V_{OUT}$ of the interface circuit 120 in the shape of a DC signal in turn results from an AC/DC conversion of said alternating AC signal produced by the harvester 110.

According to a particular exemplary embodiment of the RF emitter stage 140, the latter can be adapted to transmit signals according to a Zigbee type communication protocol, that is to say based on the standard IEEE 802.15.4 and which relates to the networks with a personal dimension WPAN (for "Wireless Personal Area Networks").

Figure 4:
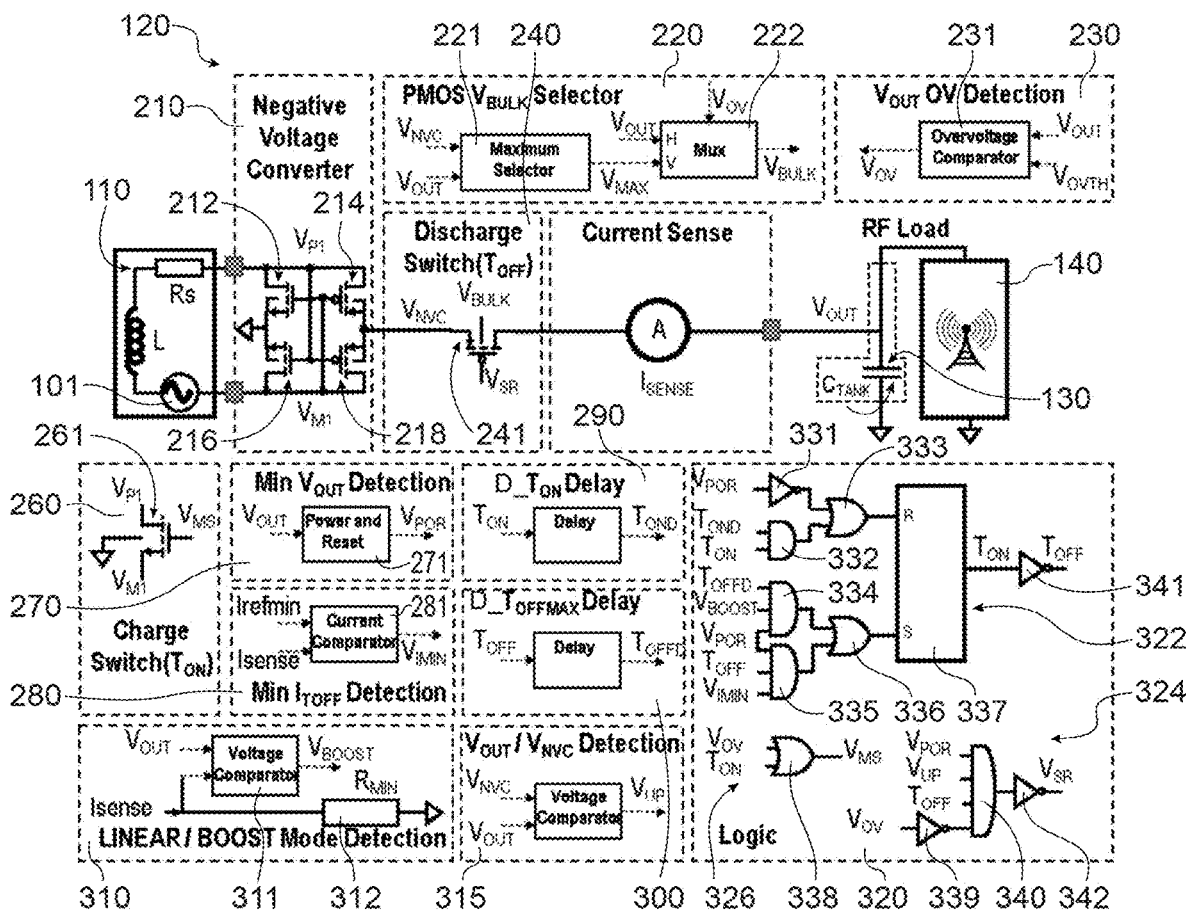
FIG. 4 serves to illustrate a detailed embodiment of the electronic interface device caused to adopt two operating modes, a first operating mode called "linear" operating mode implemented for some portions of the signal supplied by the electromagnetic energy harvester, and a second operating mode called "Boost" operating mode which is implemented on other portions of the signal supplied by the electromagnetic energy harvester during which the device is capable of alternating several times between a first configuration and a second configuration.

The electronic interface circuit 120 for electromagnetic energy harvester is typically implemented in the form of an ASIC (for "Application-Specific Integrated Circuit"), provided with different functional blocks as schematically illustrated on the exemplary embodiment given in FIG. 4.

The electronic interface circuit 120 first comprises an AC-DC converter. The AC-DC converter can be formed by a Graetz bridge-type rectifier 210 connected to the terminals P1 and M1 at the output of the first stage 110, and made by a bridge arrangement of four transistors 212, 214, 216, 218. According to a particular illustrated exemplary embodiment, the rectifier includes 2 enhancement transistors 212, 214, respectively of the N type and of the P type, provided with a gate connected to the terminal M1 and a drain connected to the terminal P1, while two other enhancement transistors 216, 218, respectively of the N type and of the P type, include a gate connected to the terminal P1 and a drain connected to the terminal M1.

The electronic interface circuit 120 is, in this exemplary embodiment, advantageously fee of inductance or external capacitance between the output of the harvesting stage 110 and the storage means 130, which allows it to be less bulky and less expensive than an interface circuit using such components.

The electronic interface circuit 120 has the particularity of being able to adopt two different operating modes.

A first operating mode, which is called "linear" operating mode, is established in particular when the output capacitance $C_{tank}$ is discharged or when, compared to an output voltage $V_{OUT}$ taken at the terminals of this capacitance $C_{tank}$, the voltage supplied by the harvester 110 is too high between the terminals P1 and M1. The linear operating mode is preferred particularly on certain portions of the first alternations of the AC signal supplied by the harvester 110 and subsequent in this example to a mechanical actuation of a wireless switch element.

The second operating mode which is referred to as "Boost" operating mode allows performing the adaptation of the impedance seen by the harvester 110 and harvesting more energy on other portions of the AC signal supplied by the harvester 110 between the terminals P1 and M1.

Figure 5:
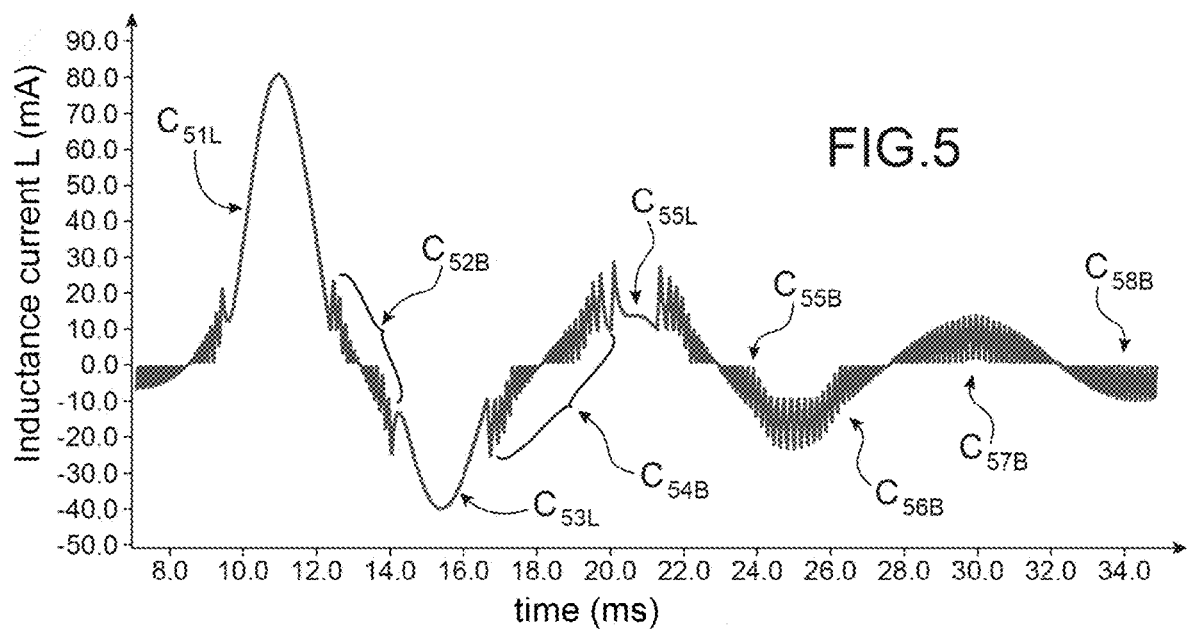
FIG. 5 serves to illustrate an example of evolution of the inductance current of an energy harvesting stage associated with an electronic interface circuit according to the invention and capable of adopting the "linear" operating mode and the "Boost" operating mode.

FIG. 5 gives, as an illustration, an example of an evolution curve, obtained by simulation, of the current in the inductance L of the harvester 110 with a succession of oscillations of decreasing amplitude, the portions of which correspond alternately to the "linear" operation mode (portions of curves $C_{51L}$, $C_{53L}$, $C_{55L}$) and to the "Boost" operating mode (portions of curves $C_{52B}$, $C_{54B}$, $C_{55B}$, $C_{56B}$, $C_{57B}$, $C_{58B}$) in a particular case given as an example where the output voltage $V_{OUT}$ is forced to a value of 2.5V, the turns of the inductance have a diameter DiamCu of 100 μm, and the inductance has a coefficient of expansion kf=0.7.

The above-mentioned "linear" and "Boost" operating modes correspond to different configurations of switches of the interface circuit 120 and particularly of a switch 260 called "charge" switch and of a switch 240 called "discharge" switch of this circuit.

The charge switch 260 is disposed between the input terminals P1 and M1 of the rectifier 210 while the discharge switch 240 is disposed between the rectifier 210 and the charge storage means 130. The discharge switch 260 thus capable of alternately connecting or disconnecting the terminal P1 and the terminal M1 from one another, is typically provided with or formed of a transistor 261, which is alternately turned on or off depending on the level of a command signal $V_{MS}$ applied on its gate.

Typically, and as can be seen in FIG. 4, the transistor 261 includes an electrode directly connected to the terminal P1 and placed at potential $V_{P1}$ and an electrode directly connected to the terminal M1 and placed at potential $V_{M1}$. Thus, when the transistor 261 is turned on, the terminals P1 and M1 are directly connected to each other. The two input terminals P1 and M1 of the interface circuit are thus short-circuited in the first configuration.

In the illustrated exemplary embodiment, the transistor 261 is an N-type transistor, the drain and the source of which are respectively connected to the terminal P1 and to the terminal M1, and the bulk (also commonly called "BODY") of which is placed at reference or ground potential.

The command signal $V_{MS}$ can in particular be a logic signal produced by a stage 326 of a logic control block 320, in other words a circuit or a portion of a logic circuit.

This control block 320 comprises a plurality of stages 322, 324, 326, formed of logic components used in combinatorial and/or sequential logic. The stages 324, 326 are particularly provided with one or more logic gate(s) 338, 339, 340, 342, while the stage 322 is formed by logic gates 331, 332, 333, 334, 335, 336, 341 and at least one element such as a flip-flop 337 capable, in some circumstances, of maintaining the values of its output(s) despite changes in input value(s).

The command signal $V_{MS}$ the level of which, corresponding to a logic state '0' or '1', determines that, respectively open (off) or closed (on), of the charge switch 260. The logic state '0' or '1' of the command signal $V_{MS}$ output signal here depends on that of a signal $T_{ON}$ called configuration indicator signal and an overvoltage detection signal $V_{OV}$ applied at the input of the stage 326. In the illustrated particular exemplary embodiment, the command signal $V_{MS}$ is produced at the output of an OR gate 338 of the stage 326 of the logic control block 320. Thus, the closing (in other words the turning on) of the charge switch 260 is carried out when the command signal $V_{MS}$ is in a given logic state, here a logic state '1', the setting of the command signal $V_{MS}$ in this given state occurring when at least $T_{ON}$ or $V_{OV}$ signals is at a logic level '1'.

The discharge switch 240, capable of alternately connecting or disconnecting the output of the rectifier 210 from the charge storage means 130 is in turn typically provided with or formed of a transistor 241 which is alternately turned on or off depending on the level of a second command signal $V_{SR}$ applied on its gate. The transistor 241 may for example be a P-type enhancement transistor, with a bulk which is placed at potential $V_{BULK}$. This potential $V_{BULK}$ can be modulated by means of a bulk voltage selector stage 220 depending in particular on a level of the signal $V_{NVC}$ produced by the rectifier 210 and on that of the voltage $V_{OUT}$ at the terminals of the capacitance $C_{tank}$.

The second command signal $V_{SR}$, the level of which, corresponding to a logic state '1' or '0', determines that, respectively open (off) or closed (on), of the charge switch 240. The second command signal $V_{SR}$ is particularly produced by a stage 324 of the logic control block 320. The second command signal $V_{SR}$ is in the illustrated exemplary embodiment taken at the output of an inverter 342, in turn arranged at the output of a logic AND gate 340. The logic state '0' or '1' of the command signal $V_{SR}$ depends in this particular exemplary embodiment on that of a threshold detection signal $V_{POR}$, of another detection signal $V_{UP}$, and of a first configuration indicator signal $T_{OFF}$, applied at the input of the AND gate 340 as well as an overvoltage detection signal $V_O$, applied at the input of this gate 340 once it has been inverted, for example by means of an inverter 339. In the illustrated exemplary embodiment, the closing (in other words the turning on) of the discharge switch 240 is carried out when the second command signal $V_{SR}$ is in a given logic state, in this example '0', the setting in this given state being in turn conditioned by each of the signals $V_{POR}$, $V_{UP}$, $T_{OFF}$, and $V_{OV}$ at the input of stage 324. The closing of the discharge switch 240 occurs only when the signals $V_{POR}$, $V_{UP}$, $T_{OFF}$, are at a same logic level, here '1', while the signal $V_O$, is at an opposite (i.e. complementary) logic level, here '0'.

The logic control block 320 of the electronic interface circuit 120 thus allows producing the command signals $V_{SR}$ and $V_{MS}$ for the opening and closing of the charge switch 260, as well as the opening and closing of the discharge switch 240, and to alternately switch these switches 240, 260 from a first configuration to a second configuration and vice versa.

The first configuration of the switches 260, 240, is that for which the charge switch 260 is turned off (open) so that the terminal P1 and the terminal M1 are disconnected and the charge switch 240 is turned on (closed), so that the rectifier 210 is connected to the charge storage means 130. Such a configuration can be performed by means of command signals $V_{MS}$ and $V_{SR}$ in this example both set to a logic level '0'.

The second configuration of the switches 260, 240 is that for which the charge switch 260 is turned on (closed) so that the terminal P1 and the terminal M1 are connected and the discharge switch 240 is turned off (open), so that the rectifier 210 is disconnected from the charge storage means 130. Such a configuration can be performed by means of command signals $V_{MS}$ and $V_{SR}$ for example both set to a logic level '1'.

At start-up, when the wireless switch has just been actuated, the output voltage $V_{OUT}$ at the terminals of the capacitance $C_{tank}$ is close to 0V and the control block 320 places the switches 240, 260 in the first configuration by default. In the illustrated example, the signal $V_{por}$ set to '0' returns the inputs R and S respectively to '1' and '0'. The signal $T_{ON}$ is consequently at '0'. The command signals $V_{MS}$ and $V_{SR}$ are in respective states, for example '1' and '0' closing the discharge switch 260 and opening the charge switch 240.

The device is then in the operating mode referred to as "linear" operating mode. The device allows passively harvesting energy until reaching a minimum voltage, $V_{min\_threshold}$, for example of the order of 1.5V, a threshold from which the device is capable of being able to change the operating mode and can switch in an operating mode called "Boost" operating mode.

To detect this threshold, the interface circuit 120 is here further provided with a block 270 for detecting a minimum value of the output voltage $V_{OUT}$, capable of detecting a passage of this voltage $V_{OUT}$ applied to the means for storing 130 electrical charges above the minimum threshold value and producing, when this detection is carried out, a threshold detection signal to the control block 320 of the control circuit. In this example, the produced detection signal results in a change of the logic state of the signal $V_{POR}$, for example set to a logic level '1'.

Figure 7:
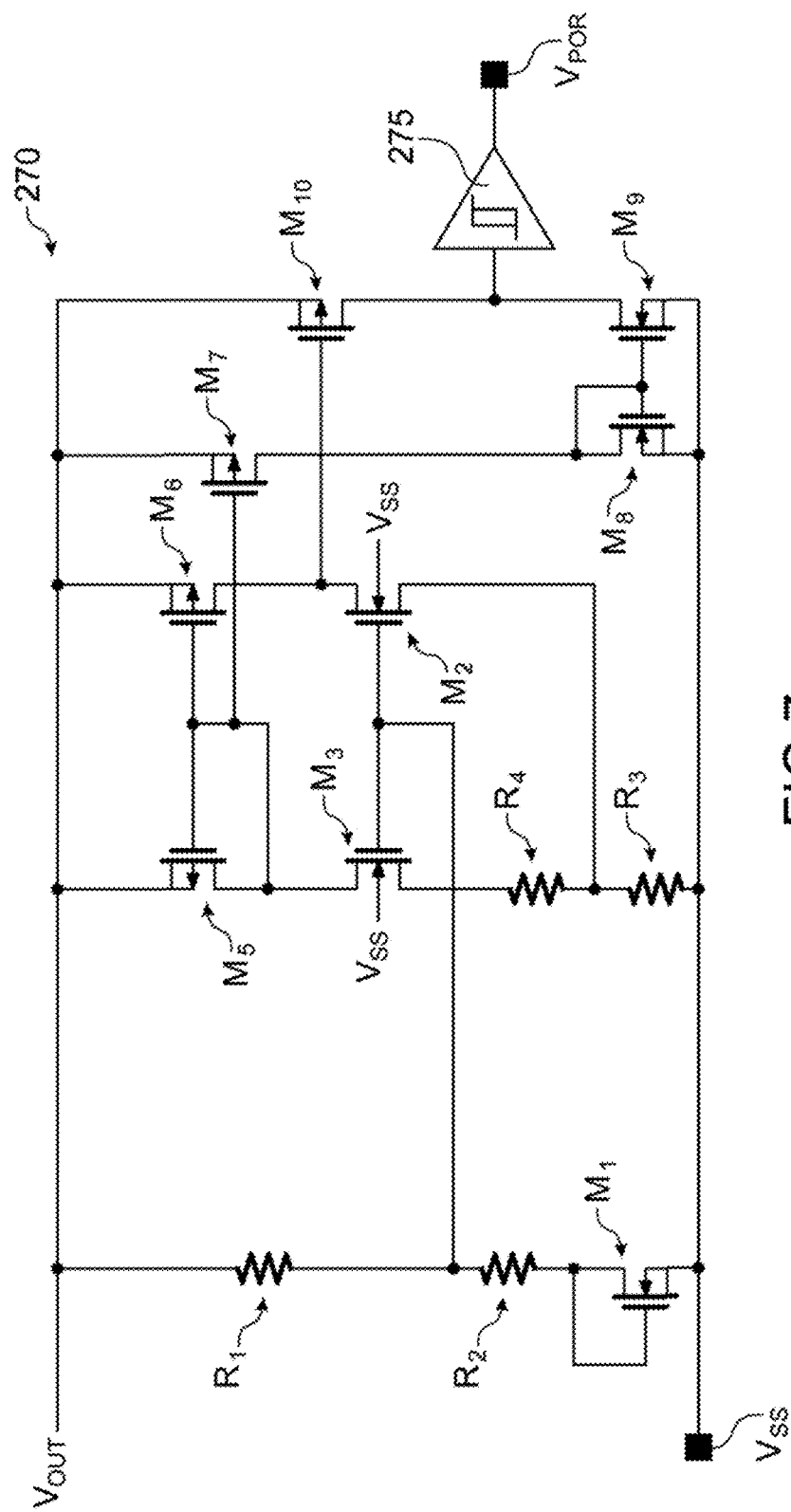
FIG. 7 serves to illustrate a particular embodiment of a block for detecting the minimum value of the output voltage in an interface circuit as implemented according to an embodiment of the present invention.

A particular exemplary embodiment of the detection block 270 is given in FIG. 7. Here it includes a threshold flip-flop which may be of the non-inverting Schmitt flip-flop-type 275 supplying the logic signal $V_{POR}$ at the output and whose analogue input is linked to a stage receiving the voltage $V_{OUT}$ and provided with a plurality of transistors $M_1$, $M_2$, $M_3$, $M_5$, $M_6$, $M_7$, $M_8$, $M_9$, $M_{10}$. The minimum threshold value above which the control block 320 emits the detection signal depends in particular on the choice of the resistance values $R_1$, $R_2$, $R_3$, $R_4$ and the size of transistors $M_1$, $M_2$, $M_3$ of the circuit.

The logic control block 320 is here configured so that a mode change from the linear mode to the "Boost" mode is conditioned by the state of the command signal $V_{SR}$ which in turn is conditioned by the state of the signal $V_{por}$.

In the illustrated particular exemplary embodiment, the stage 324 producing the command signal $V_{SR}$ can only be set to a logic state allowing to open the discharge switch 240 if the threshold detection signal is produced, which corresponds to a change of the logic state of the signal $V_{por}$, in this example set to '1'. This signal $V_{por}$ is also transmitted to a stage 322 capable of producing complementary indicator signals $T_{OFF}$, $T_{ON}$, serving as input signals of stages 324, 326 of the control block.

A switching from the linear operating mode to the Boost operating mode is effectively carried out when a voltage equal to the product $R_{min}*I_{sense}$ of a charging current $I_{sense}$ to the capacitance $C_{tank}$ disposed at the output of the interface circuit 120 by a resistance 312 with a predetermined value $R_{min}$ becomes less than the output voltage $V_{OUT}$ at the terminals of the capacitance $C_{tank}$. The charge current $I_{sense}$ typically comes from a circuit current detector.

In this case, where $V_{OUT} \geq R_{min}*I_{sense}$, it becomes preferable to adopt the operating mode in "Boost" mode because the charge impedance of the harvesting stage 110 can then be controlled and set to a value $R_{opt}$.

The "Boost" operating mode allows optimising the energy harvesting of the system on the alternations of lower amplitude of the signal at the output of the harvesting stage 110.

The interface circuit 120 can be provided with an operating mode detection block 310. This block 310 is typically provided with a comparator 311 to compare the output voltage $V_{OUT}$ with the product $I_{sense}*R_{min}$.

Advantageously, the resistance $R_{min}$ is such that: $R_{min}=K1*Rs=K2*R_{opt}$, with K2<K1. The coefficients K1 and K2 depend on the type of electromagnetic energy harvesting stage used. For example, $R_{min}=4*Rs=2*R_{opt}$ can be provided in the case of a particular harvester used in a particular wireless switch system.

The comparator 311 produces at the output a signal $V_{BOOST}$ which, when the output voltage $V_{OUT}$ becomes greater than $I_{sense}*R_{min}$, changes state and switches for example to a logic level '1', which can allow triggering a switching to the Boost operating mode.

Figure 12:
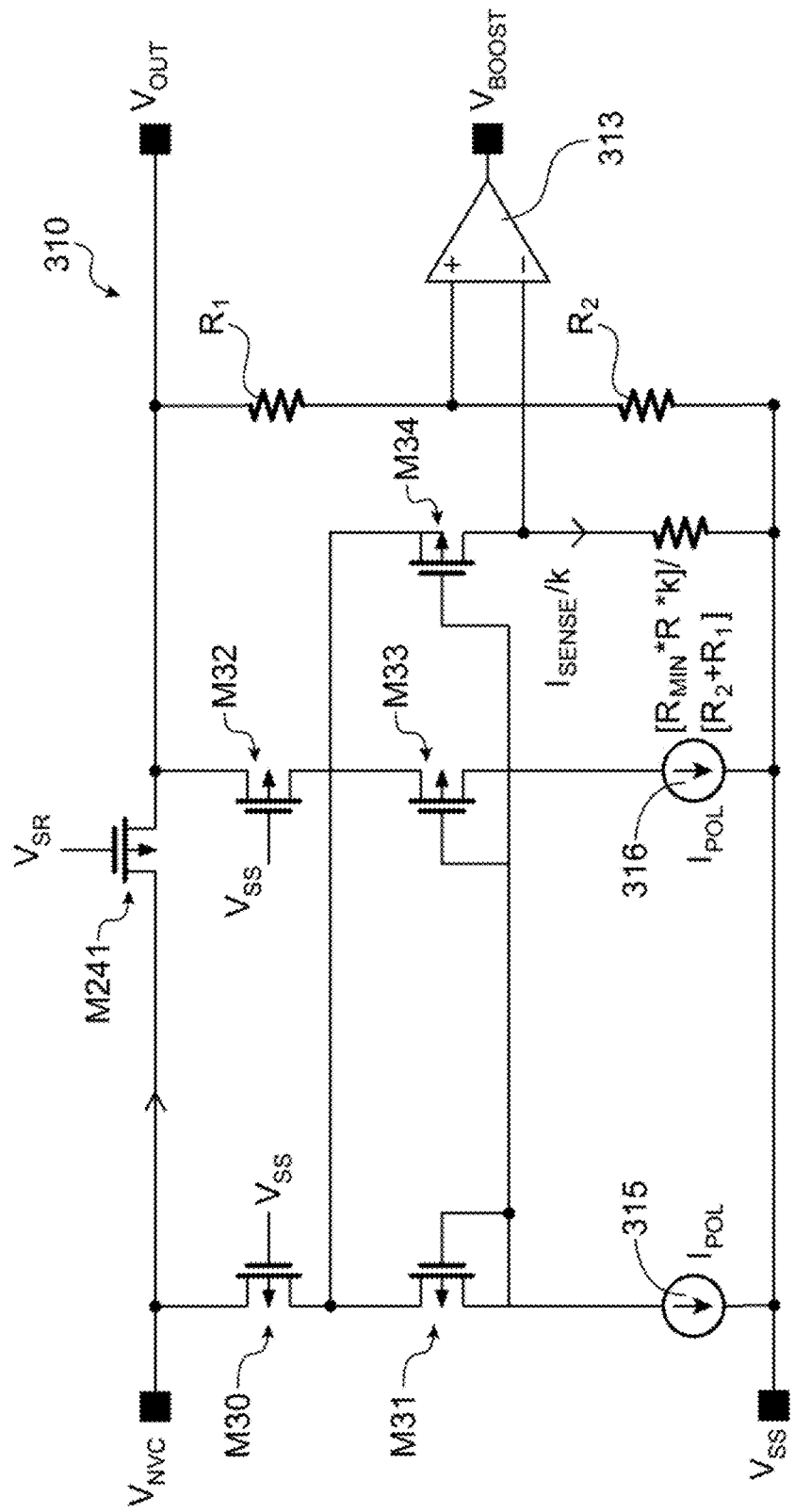
FIG. 12 serves to illustrate a particular exemplary embodiment of an operating mode detection stage as implemented in an interface circuit according to an embodiment of the present invention.

According to a particular exemplary embodiment illustrated in FIG. 12, the detection block 310 is formed of transistors $M_{30}$, $M_{31}$, $M_{32}$, $M_{33}$, $M_{34}$, and supplies the signal $V_{BOOST}$ at the output via a voltage comparator 313 configured, when the command signal $V_{SR}$ is in a state turning the switch transistor $M_{241}$ ON, to compare a potential proportional to the output voltage $V_{OUT}$ and which depends on resistance values $R_1$, $R_2$ and a potential which depends on the current $I_{sense}$ of a resistance R, which in turn is dependent on the resistance values $R_1$, $R_2$, and on a value $R_{min}$ which is selected according to the output resistance of the harvester.

For this purpose, the signal $V_{BOOST}$ is transmitted to the control block 320 and particularly to a stage 322 capable of producing the indicator signals $T_{OFF}$, $T_{ON}$ respectively of first configuration and second configuration. The indicator signals $T_{OFF}$, $T_{ON}$ here have logic levels which are complementary to one another. The indicator signals $T_{OFF}/T_{ON}$ are re-injected at the input of the control block stage 322.

Respective changes in the states of the configuration indicator signals $T_{OFF}/T_{ON}$ are capable of modifying that of the command signals $V_{MS}$ and $V_{SR}$ of the state of the switches 260, 240. For example, when the configuration indicator signal $T_{ON}$ switches to a logic level '1', this is likely to cause a change of state of the command signal $V_{MS}$ which can switch to a logic level '1', while the indicator signal $T_{OFF}$ is at a level '0' (complementary to that of $T_{ON}$) which causes a change of state of the command signal $V_{SR}$.

In the particular embodiment illustrated in FIG. 4, the triggering signal $V_{BOOST}$ is particularly transmitted at the input of an AND gate 334, the output of which serves as an input to an OR gate 336 having an output which in turn is linked to the input S (SET) of an RS-type flip-flop 337 supplying at the output the second configuration indicator signal $T_{ON}$.

A detection of a condition $V_{OUT} \geq R_{min}*I_{sense}$ thus allows setting to a logic level '1' the signal $V_{BOOST}$ which, provided that the signals $V_{por}$ and $T_{OFFD}$ are also at a logic level '1', allows triggering a setting to a logic level '1' of the input SET of an RS flip-flop 337 of the stage 322, which can lead to a setting to a logic level '1' of the signal $T_{ON}$ produced at the output of the stage 322, and consequently, a setting to a logic level '0' of the first configuration indicator signal $T_{OFF}$ and resulting from an inversion of the signal $T_{ON}$ by an inverter 341 placed at the output of the flip-flop 337. This can thus allow placing the command signals $V_{SR}$ and $V_{MS}$ in respective states allowing to place the device in the second configuration of the switches 240, 260.

In the "Boost" mode, once it has been placed in the second configuration, the circuit can be placed back in the first configuration then placed again in the second configuration of the switches. An alternation of one or more phase(s) of the second configuration and of the first configuration can thus be carried out. In "Boost" mode, the loop thus alternates at least one phase of charging the inductance L of the harvester 110 with a charge switch 260 closed for a duration D_Ton, then at least one phase of discharging the inductance L with a discharge switch 240 closed for a maximum duration D_Toffmax which is at most equal to the charging duration D_TON. Typically, several alternations are made between the first and second configuration. It will be noted that there are no other intermediate configurations between these two configurations and that the alternation is therefore made in this embodiment only between these two configurations.

The duration of the phases corresponding to the second configuration is fixed at a duration D_TON. For this purpose, the device is provided with a block 290 indicating the duration lapse of the second configuration which, after receiving said indicator signal $T_{ON}$, generates after a fixed delay D_TON, a signal $T_{OND}$ indicating the duration lapse of the second configuration to the stage 322 of the logic control block 320. Once this fixed delay has elapsed, the logic control block 320 can then modify the state of the signals $T_{ON}$ and $T_{OFF}$, which triggers a change of state of the command signals $V_{MS}$ and $V_{SR}$ and allows returning in the first configuration.

The block indicating 290 the duration lapse of the second configuration can for example be provided with one or more capacitance(s) whose charging time determines the fixed delay D_TON.

Figure 9:
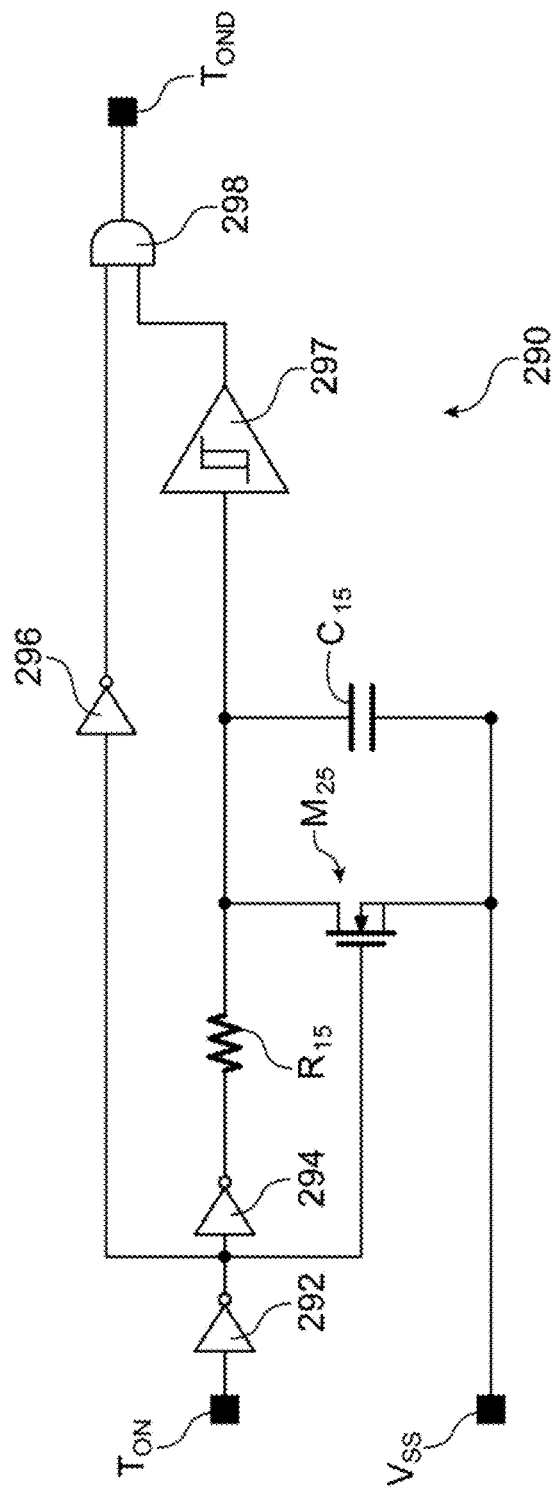
FIG. 9 serves to illustrate a particular exemplary embodiment of a block indicating the duration lapse of a second configuration in an interface circuit as implemented according to an embodiment of the present invention.

A particular exemplary embodiment of the first block 290 is given in FIG. 9. In this example, the signal $T_{OND}$ indicating the duration lapse of the second configuration is supplied by an AND gate 298 one input of which receives the signal $T_{ON}$ here after having been inverted then re-inverted by means of inverters 292, 296 and another input of which is linked to the output of a non-inverting threshold flip-flop 297 which depends on the charge of a capacitance $C_{15}$, when it is connected to a resistance $R_{15}$ and is not short-circuited by a switch formed here by a transistor $M_{25}$ the gate of which is commanded by the inverse of the signal $T_{ON}$. In this exemplary embodiment, in order to be able to adjust the duration of the delay D_TON, the respective values of the capacitance $C_{15}$ and of the resistance $R_{15}$ are adapted. A maximum duration D_TOFFmax of the phases corresponding to the first configuration is also predetermined. For this purpose, the device is provided with a block 300 indicating the maximum duration lapse of the first configuration for, after receiving the indicator signal $T_{OFF}$, generating after a predetermined delay D_TOFFmax a signal $T_{OFFD}$ indicating the maximum duration lapse of the first configuration.

The block 300 indicating the maximum duration lapse of the first configuration can for example be provided with one or more capacitance(s) the charging time of which determines the delay D_TOFFmax.

Figure 10:
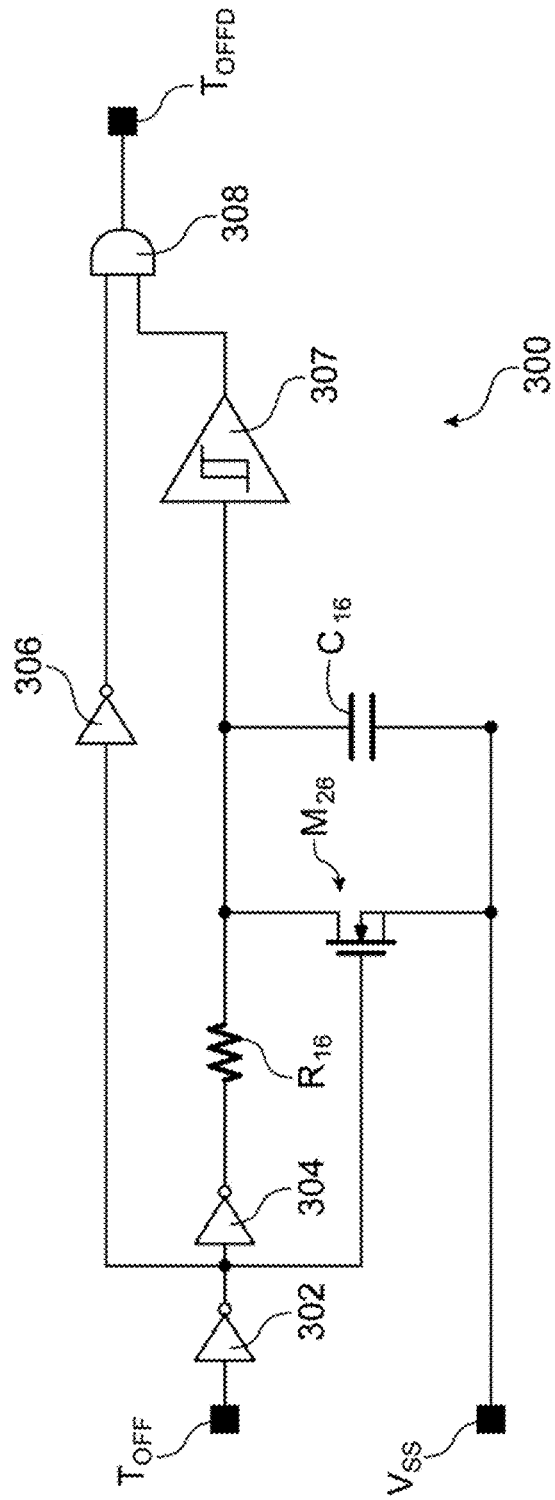
FIG. 10 serves to illustrate a particular exemplary embodiment of a block indicating the duration lapse of a first configuration in an interface circuit as implemented according to an embodiment of the present invention.

A particular exemplary embodiment of this block 300 generating the signal $T_{OFFD}$ is given in FIG. 10. In this example, the block 300 has a construction similar to that of the block 290 generating the $T_{OND}$, the components 292, 294, $R_{15}$, $M_{25}$, $C_{15}$, 296, 297, 298 being replaced by components 302, 304, $R_{16}$, $M_{26}$, $C_{16}$, 306, 307, 308 of the same type.

Thus, in this exemplary embodiment, in order to be able to adjust the duration of the delay D_TOFFmax, the respective values of the capacitance $C_{16}$, and of the resistance $R_{16}$ are adapted.

The lapse of the first configuration can be triggered subsequently to a change of state of the maximum lapse indicator signal $T_{OFFD}$ or by a charge $I_{sense}$ current threshold detection signal $V_{IMIN}$ produced by a minimum current detection stage 280. This stage can be provided with a current comparator 281, to compare the current $I_{SENSE}$ with a threshold current $I_{refmin}$. The minimum current detection signal $V_{IMIN}$ to the control block 320 at the output of the comparator 321 indicates, by a change of state, for example set to a logic level '1' when the current $I_{SENSE}$ falls below this threshold.

In the embodiment of FIG. 4, the logic control block 320 is thus configured to modify the state of the indicator signal $T_{ON}$ and of the other indicator signal $T_{OFF}$, complementary to the latter, according to the respective states of the inputs R and S of the flip-flop 337, the input R being dependent on the signals $T_{ON}$, $T_{OND}$, the input S being dependent on the signals $T_{OFF}$, $T_{OFFD}$.

The second configuration is signified for example by setting the indicator signal $T_{ON}$ to the level '1', while the complementary signal $T_{OFF}$ is set to '0' when the second configuration has elapsed, this lapse is signified by setting the signal $T_{OND}$ to the level '1', which causes the input R of the flip-flop 337 to be set to '1' and allows, to the extent that the signals $T_{OFF}$ and $T_{OFFD}$ are at '0', a change of state of the signals $T_{ON}$ and $T_{OFF}$ leading to a setting in the first configuration.

The first configuration is signified by setting the indicator signal $T_{OFF}$ to '1', while the complementary signal $T_{ON}$ is set to '0'. When the first configuration has elapsed, this lapse is signified by setting the signal $T_{OFFD}$ to a level '1', which is capable of causing the input S of the flip-flop 337 to be set to '0' and may allow, to the extent that the signals $T_{ON}$ and $T_{OND}$ are at '1', a change of state of the signals $T_{ON}$ and $T_{OFF}$.

The fixed duration D_TON can be such that L/2Rs≤ D_TON≤L/Rs. For a particular energy harvester of a particular wireless switch system, the predetermined maximum duration D_TOFFmax can for example be provided such that D_TON=(4*L)/(7*Rs) D_TOFFmax.

Such durations allow having a charge impedance seen by the harvester as close as possible to an optimal impedance $R_{opt}$.

For example, in the particular case of a harvester with an inductance having turns of diameter of the order of 100 μm and a coefficient of expansion of the order of 0.7, the durations D_TON and D_TOFFmax can be equal and of the order of 80 μs.

The interface circuit 120 can also be provided with another detection stage 315 provided with a comparator 316, capable of comparing the output voltage $V_{OUT}$ applied to the electrical charge storage means 130 and the voltage $V_{NVC}$ at the output of the rectifier, and produce a comparison signal $V_{UP}$ indicating, for example when $V_{UP}$ is at a logic state '1' when the voltage $V_{NVC}$ at the output of the rectifier 210 exceeds the output voltage $V_{OUT}$. In this example, maintaining the discharge switch 260 closed is, thus, also conditioned by that of a logic state '1' of the comparison signal $V_{up}$. When this voltage $V_{NVC}$ becomes less than $V_{OUT}$, a change of state of the comparison signal $V_{UP}$ which switches to '0' causes that of the command signal $V_{SR}$ of the discharge switch 260 so as to open it.

To prevent an overvoltage at the output $V_{OUT}$ of the interface circuit 120, the latter can advantageously be provided with an overvoltage detection stage 230, capable of producing an overvoltage detection signal when the output voltage $V_{OUT}$ exceeds a predetermined threshold. This overvoltage detection stage 230 is in this example provided with a voltage comparator 231 configured to compare the output voltage $V_{OUT}$ with a predetermined threshold voltage $V_{OVTH}$, for example of 5.3V.

Figure 8:
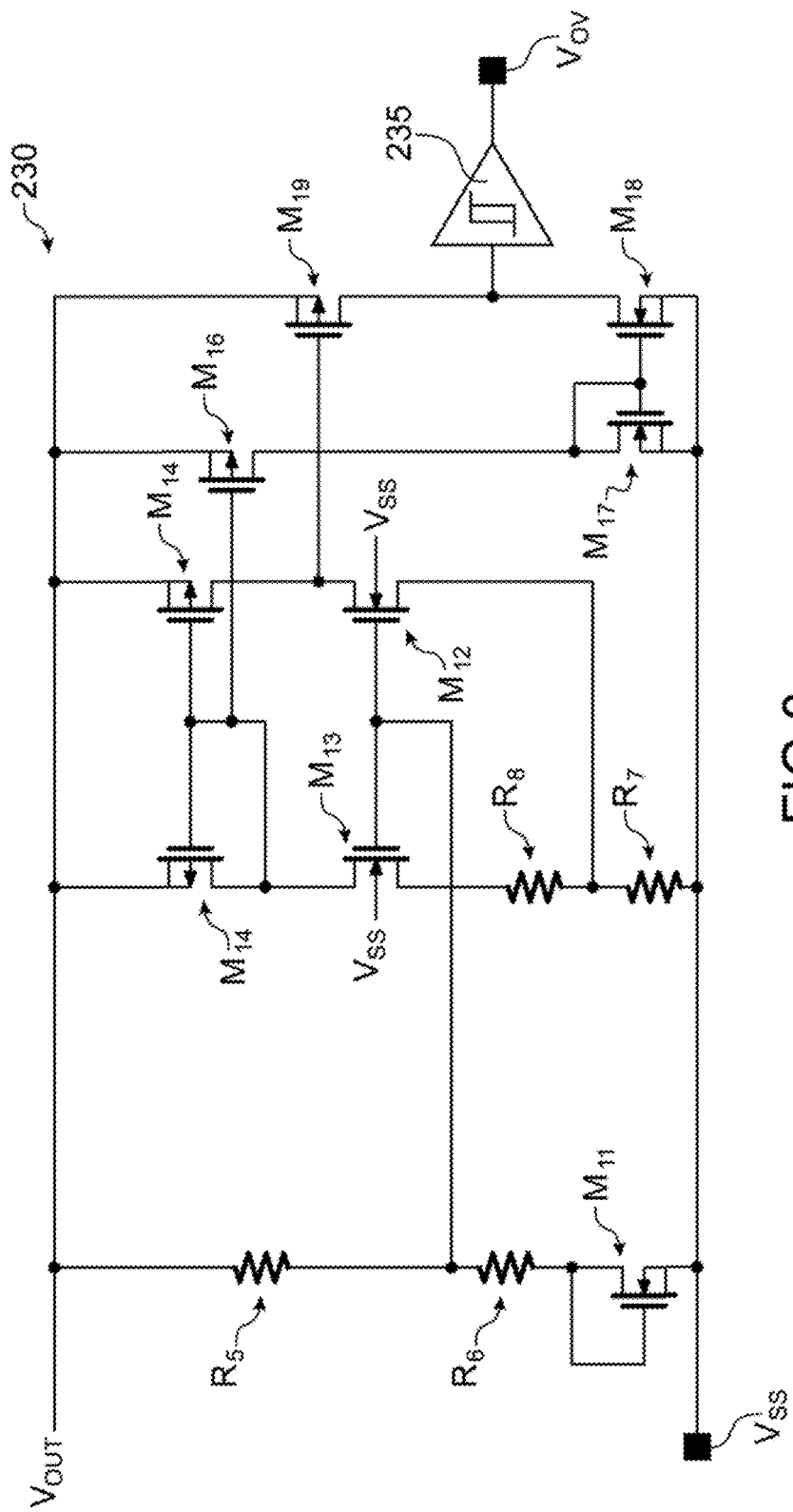
FIG. 8 serves to illustrate a particular exemplary embodiment of a stage for detecting an overvoltage in an interface circuit as implemented according to an embodiment of the present invention.

A particular exemplary embodiment of the overvoltage detection stage 230 is given in FIG. 8. In this example, it has a construction similar to that of stage 270 for detecting the minimum output voltage value.

The stage 230 here includes a threshold flip-flop of the non-inverting Schmitt flip-flop-type 235 supplying a logic signal $V_{ov}$ at the output and whose analogue input is linked to a stage receiving the voltage $V_{OUT}$ and provided with a plurality of transistors $M_{11}$, $M_{13}$, $M_{14}$, $M_{15}$, $M_{16}$, $M_{17}$, $M_{18}$, $M_{19}$.

The overvoltage detection signal results in a change of the logic state of the signal $V_{ov}$ emitted at the input of the stages 324, 326 of the control block 320. In the particular example illustrated in FIG. 4, a change of state, for example to a level '1' of the signal $V_{ov}$ modifies the state of the command signal $V_{SR}$ of the discharge switch 240 and is also capable of modifying the state of the command signal $V_{MS}$ of the charge switch 260. Thus, when the threshold $V_{OVTH}$ is exceeded, the control block 320 is configured, subsequently to the reception of said overvoltage detection signal $V_{ov}$, to set the first command signal $V_{MS}$ to a level allowing to turn the charge switch 260 on and to set the second command signal $V_{SR}$ to a level allowing to turn the discharge switch 240 off.

Advantageously, subsequently to the detection of a voltage threshold at the output, the bulk potential of the discharge transistor 241 is placed at a voltage which results from a selection of the maximum between the output voltage $V_{OUT}$ and the potential $V_{NVC}$ supplied by the rectifier 210 and applied to the source of the discharge transistor 241.

This selection can be implemented by means of a bulk potential selection stage 220 provided with a maximum selector 221 provided with an input receiving the output voltage $V_{OUT}$ from the interface device and another input receiving the output $V_{OUT}$ potential $V_{NVC}$ from the interface device and emitting a potential $V_{MAX}$ at the output equal to the maximum of these two voltages.

Figure 11:
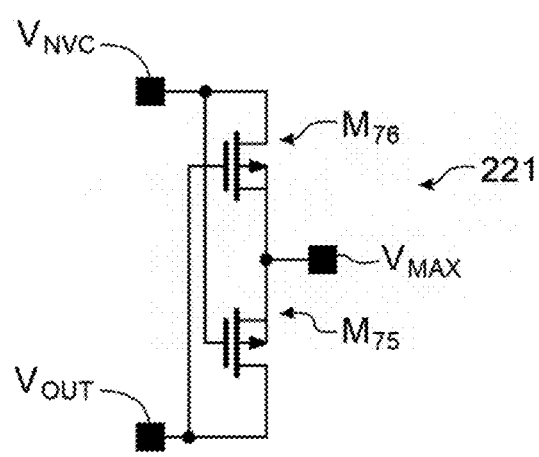
FIG. 11 serves to illustrate a particular exemplary embodiment of a maximum selector circuit as implemented in an interface circuit according to an embodiment of the present invention.

A particular exemplary embodiment of the maximum selector 221 is given in FIG. 11 in the form of a common-source transistor $M_{75}$, $M_{76}$ circuit supplying the potential $V_{MAX}$. The respective gates of these transistors $M_{75}$, $M_{76}$ respectively receive the output voltage $V_{OUT}$ and the potential $V_{NVC}$ and the respective drains receive respectively the potential $V_{NVC}$ and the output voltage $V_{OUT}$.

This selector 221 is typically associated with a multiplexer 222 configured to propagate, depending on the value of the overvoltage detection signal $V_{ov}$ emitted at the output of the overvoltage detection stage 230, one of the inputs thereof at the output, between a first input placed at the output potential $V_{OUT}$ and a second input placed at the potential $V_{MAX}$ emitted by the stage 221. The output of the multiplexer 222 is connected to the bulk of the discharge transistor 241 and applies the output voltage $V_{OUT}$ thereto by default. Then, when a threshold exceeding by the detection circuit 230 is detected, the voltage maximum between the output voltage $V_{OUT}$ and the potential $V_{NVC}$ supplied by the rectifier 210.

Figure 1:
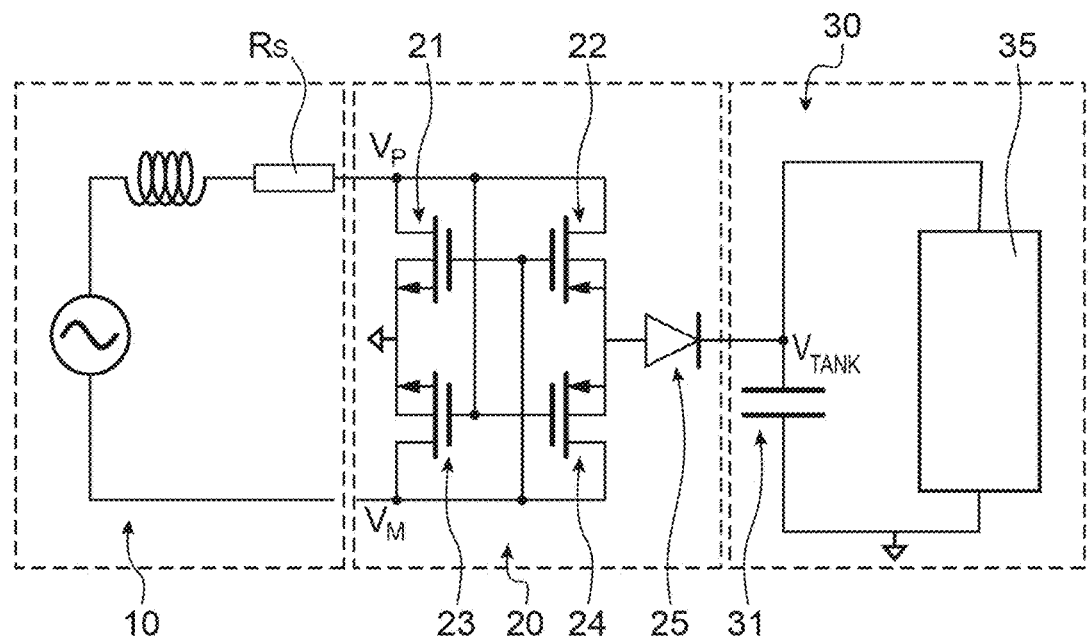
FIG. 1 serves to illustrate an example of a system, according to the prior art, comprising an energy harvesting stage associated with a conventional circuit for converting an alternating signal into a continuous signal making an interface with a means for storing electrical energy associated with an RF emitter stage.

The table below establishes a comparison of performances in terms of energy harvested and efficiency, between on the one hand a conventional energy harvesting system as illustrated in FIG. 1 and a harvesting system provided with an interface circuit 120 as described above, and this for different harvesting stages corresponding in particular to different sizes of coils (DiamCu) and different quality factors kf. The results are given with an output voltage fixed at $V_{OUT}$=2.5V.

| Diam Cu | kf | Eopt (μJ) | Eharv FIG. 1 | Efficiency (%) | Eharv Circuit 120 (μJ) | Circuit Efficiency 120 (%) |
|---|---|---|---|---|---|---|
| 63 μm<br>Rs = 220Ω<br>L = 18 mH | 0.415 | 785 | 423 | 54.4 | 530<br>D_Ton = 46 μs | 68.2 |
| 80 μm<br>Rs = 140Ω<br>L = 19.6 mH | 0.7 | 955 | 487 | 51 | 597<br>D_Ton = 80 μs | 62.5 |
| 100 μm<br>Rs = 60Ω<br>L = 8 mH | 0.7 | 955 | 535 | 56 | 766<br>D_Ton = 80 μs | 80.2 |
| 110 μm<br>Rs = 40Ω<br>L = 5.5 mH | 0.7 | 955 | 510 | 53.4 | 824<br>Ton = 80 μs | 86.2 |

The interface circuit 120 without inductance allows obtaining better yields and extract more energy from the harvester than a conventional solution with discrete components. This is particularly true since the output impedance of the harvester is low and the diameter Dcu of the copper turns forming the coil is large.

The advantages provided by the dual-mode interface circuit 120 which has been described above are the following:

- an improved electrical yield with a harvested energy close to the optimal energy for harvesters with low output impedance;
- an adaptability of the harvester used by adapting the parameters of some blocks of the circuit according to the output impedance $R_s$ of the harvester 110;
- an optimisation of the harvester which allows using a harvester with a large copper diameter of the coil which allows reducing its output impedance and therefore the cost of the harvester;
- a low cost of integration and of all the necessary components;
- the implementation of an architecture using the inductance of the harvester where the voltage excursion is limited without necessarily having to use specific components.

Figure 6:
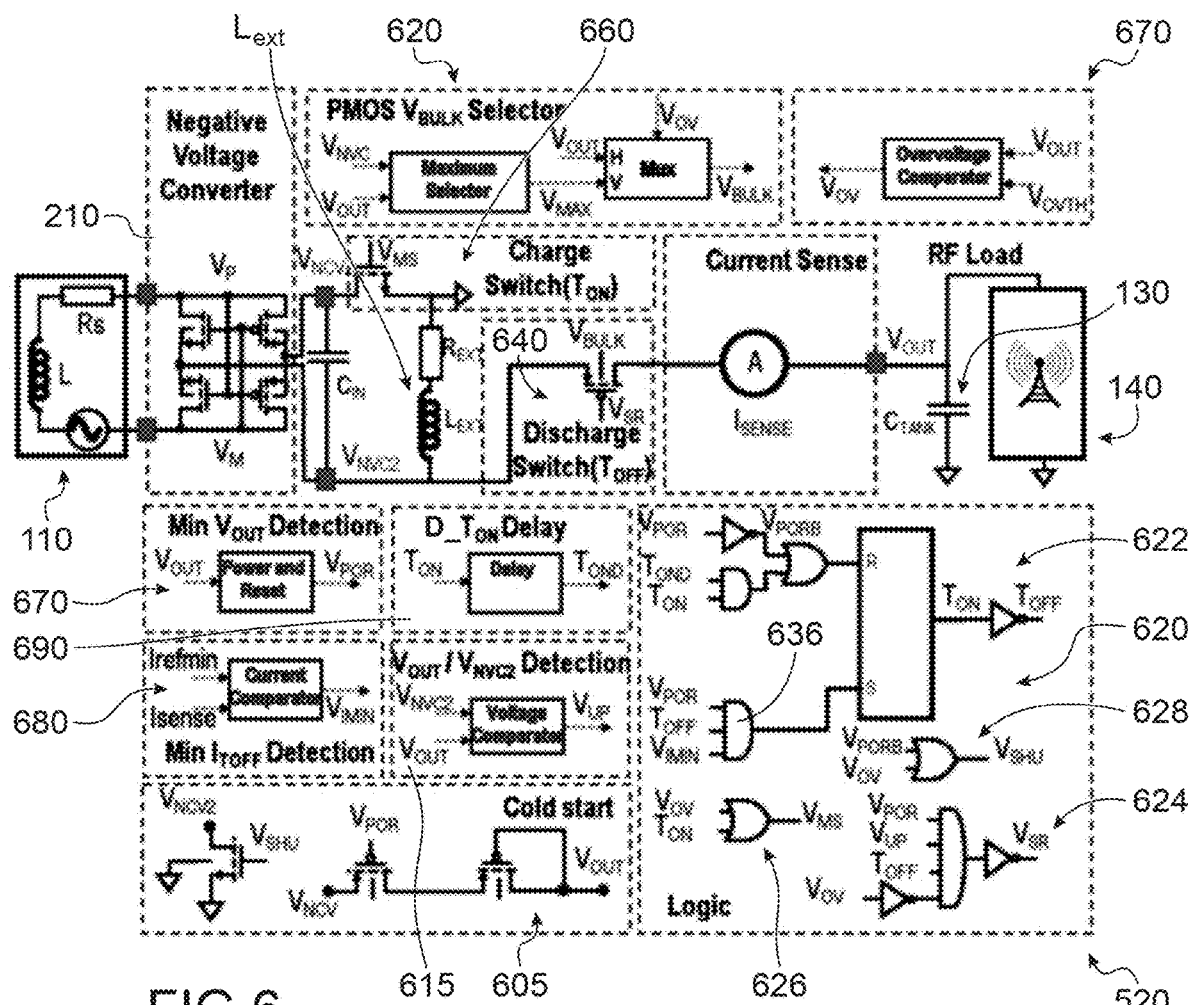
FIG. 6 serves to illustrate an example of an electronic interface circuit between an electromagnetic energy harvesting stage and an energy storage means associated with an RF emitter and provided with an external inductance in addition to that of the electromagnetic harvesting stage.

Moreover, substantially the same performance levels are obtained compared to a solution which is more expensive and which provides an interface circuit 520 of the ASIC type such as that illustrated in FIG. 6.

This interface circuit 520 this time uses at least one additional external inductance $L_{ext}$. The circuit allows alternating charging phases of the external inductance $L_{ext}$ during which the charge switch 660 is closed and the discharge switch 640 is open for a fixed time DTon and discharging phases for a duration DToff where the charge switch 660 is closed (on) and the discharge switch 640 is closed.

The duration DTon is for example such that $DT_{On}=1.85*Lext/Rs$ for a particular given harvester used in a particular wireless harvester system.

This duration is fixed by a lapse indicator block 690 with a duration of function similar to that 290 described previously in connection with FIG. 4.

The duration DToff ends when the current of the external inductance $L_{ext}$ is cancelled. The duration DToff is given by a signal $V_{IMIN}$ produced by a minimum current detection stage 680 with a function similar to that 280 described previously in connection with FIG. 4. The discharge 640 and charge 660 switches are here commanded by a logic control block 620 formed by stages 626, 624, of the type of those 322, 324 of the control block 320 described previously in connection with FIG. 4.

The logic control block 620 is provided with another stage 620 with a function similar to that of the block 320 described previously in connection with FIG. 4, to produce configuration indicator signals $T_{ON}$, $T_{OFF}$, but the respective states of which depend this time on the signals $T_{ON}$, $T_{OND}$, $T_{OFF}$, $V_{IMIN}$ and on a signal $V_{por}$ produced by a stage 670 for detecting a minimum output voltage value of the type of that 270 described above in connection with FIG. 4. The circuit 520 is, as for the solution without external inductance, also provided with an overvoltage detection stage 630 and a circuit 620 for selecting the potential of the bulk. The circuit 520 is here further provided with a cold start stage 605 receiving a signal $V_{shu}$ supplied by a stage 628 of the control block 620 and the signal $V_{por}$, and configured to place terminals NVC and NVC2 of the output of the rectifier 210 according to a configuration given at start-up when the output voltage $V_{out}$ is less than a given threshold, then modify this configuration when this threshold is reached. This interface circuit 520 allows extracting more energy from the harvester than a solution according to the prior art implemented with discrete components, but turns out to be more cumbersome when integrated on silicon and also more expensive than the circuit previously described in connection with FIG. 4.

The invention claimed is:

1. An electronic interface circuit for electromagnetic energy harvesting, to be disposed between an electromagnetic energy harvesting stage and a load stage, the electromagnetic energy harvesting stage having an equivalent electrical circuit provided in series with an alternating voltage generator, an inductance L and an output impedance, the generator producing an alternating AC signal resulting from a conversion of mechanical energy into electromagnetic energy, the load stage being provided with a means for storing electrical charges, particularly a capacitance,
said electronic interface circuit comprising:
an AC/DC converter for converting an input signal between a first terminal and a second terminal connected at the output of said harvesting stage, and producing a DC signal at the input of the load stage, the converter being provided with a rectifier for producing a rectified signal to said means for storing electrical charges,
a first switch, arranged between the first terminal and the second terminal and capable of alternately connecting or disconnecting the first terminal and the second terminal from one another, the closed or open state of the first switch being governed by a first command signal, a second switch, disposed between an output of the rectifier and the load stage and capable of alternately connecting or disconnecting the output of the rectifier from said load stage, the open or closed state of the second switch being governed by a second command signal, the electronic interface circuit being further provided with a logic control block configured to produce said first command signal and said second command signal, the control block being capable of alternately switching said switches from a first configuration to a second configuration and from the second to the first configuration, the first configuration being a configuration wherein the first switch is open and the second switch is closed, so that said first terminal and said second terminal are disconnected and the output of said rectifier is connected to said means for storing electrical charges, the second configuration being a configuration wherein the first switch is closed and the second switch is open so as to disconnect the output of the rectifier from said load stage and connect the first terminal and the second terminal to each other, said logic control block being further configured, in a given operating mode of said circuit, to trigger an alternation between said first configuration and said second configuration several times.

2. The circuit according to claim 1, further comprising an operating mode detection stage provided with a comparator for comparing an output voltage applied to said charge storage means with a voltage equal to a product $R_{min}*I_{sense}$ of a current $I_{sense}$ supplied at the output of said rectifier and capable of being injected into said charge storage means by a resistance $R_{min}$ of a predetermined value and which depends on the output impedance value $R_s$ of said electromagnetic energy harvesting stage, particularly so that $R_{min}=K*Rs$, K being a real number, and generating when this product is less than the output voltage, a trigger signal to said logic control block and capable of triggering a switching from the first configuration to said second configuration and in said given operating mode wherein the circuit is then capable of alternating one or more phase(s) in said first configuration and one or more phase(s) in said second configuration.

3. The circuit according to claim 1, wherein the second command signal has a logic state which depends on that of a first configuration indicator signal produced by said logic control block, the first command signal has a logic state depending on that of a second configuration indicator signal produced by said logic control block and complementary to the first configuration indicator signal, the control block being capable of modifying said second configuration indicator signal subsequently to a reception of said trigger signal, the phase(s) in said second configuration having a fixed duration D_TON at the end of which said control block automatically modifies the second configuration indicator signal, the phase(s) in said first configuration having a predetermined maximum duration D_TOFFmax controlled by the control block and provided at most equal to the fixed duration D_TON.

4. The circuit according to claim 3, wherein the fixed duration D_TON and the predetermined maximum duration D_TOFFmax are such that: $L/2Rs \leq D\_TON \leq L/Rs$.

5. The circuit according to claim 3, further provided with a first block indicating the duration D_TON lapse of a second configuration for, after a change of state of said second indicator signal, generating after a predetermined delay equal to said fixed duration D_TON, a signal indicating the duration lapse of the second configuration to the control block so as to trigger a change of state of said second configuration indicator signal.

6. The circuit according to claim 3, further provided with: a block indicating the maximum duration D_TOFF lapse of the first configuration for, after a change of state of said first configuration indicator signal, generating after a predetermined delay a signal of maximum duration lapse of the first configuration to the control block capable of triggering a change of state of the first configuration indicator signal.

7. The circuit according to claim 1, further comprising: a minimum current detection stage, particularly provided with a current comparator, for detecting a current capable of being supplied at the input of said load stage and being injected into said charge storage means and when said current supplied at the input of said load stage falls below a threshold, consequently generating a minimum current detection signal to the control block capable of triggering a change of configuration from the first configuration to the second configuration.

8. The circuit according to claim 1, further provided with a stage for detecting a minimum output voltage value, particularly provided with a threshold detector, configured to detect a passage of the output voltage applied to the means for storing electrical charges above a threshold value and modify, when this detection is carried out, a logic state from a first state to a second state of a threshold detection signal to the logic control block, said logic control block being configured to condition the triggering of a switching from the first configuration to the second configuration upon said state modification of said threshold detection signal.

9. The circuit according to claim 8, said logic control block being configured to trigger the switching from the second configuration to the first configuration subsequently to a change of state from the second state to the first state of said threshold detection signal.

10. The circuit according to claim 1, further provided with another detection stage provided with a comparator, configured to compare the output voltage applied to the means for storing electrical charges and the voltage at the output of the rectifier, and produce a comparison signal having a state indicating whether the voltage at the output of the rectifier is greater than the output voltage applied to the storage means, the control block being configured to condition the closing of the first switch to a setting in a given state of said comparison signal.

11. The circuit according to claim 1, further comprising a stage for detecting overvoltages of said voltage at the terminals of said charge storage means, the overvoltage detection stage being provided with a comparator configured to compare said voltage at the terminals of said charge storage means with a predetermined threshold voltage, and produce an overvoltage detection signal when the predetermined threshold voltage is exceeded, the control block being further configured, subsequently to the reception of said overvoltage detection signal, to trigger a change of state of said second command signal so as to open the second switch, the reception of said overvoltage detection signal being further capable of triggering a change of state of said first command signal so as to close the first switch.

12. The circuit according to claim 11, wherein the second switch comprises a discharge transistor including a bulk region, the device further comprising a bulk potential selection circuit configured, subsequently to the reception of said overvoltage detection signal, to select a given potential, the highest between a voltage at the output of the rectifier applied to a terminal of said discharge transistor and said voltage at the terminals of said charge storage means, and apply the selected given potential to said bulk region.

13. The circuit according to claim 1, wherein the means for storing electrical charges is capable of being associated with an RF emitter provided for emitting an RF signal according to the filling of said means for storing electrical charges.

14. The circuit according to claim 1, wherein the first switch is formed of a transistor including an electrode directly connected to said first terminal and an electrode directly connected to the second terminal.

15. A wireless switch system, comprising:
an electromagnetic energy harvesting stage,
an electronic interface circuit arranged at the output of the electromagnetic energy harvesting stage,
a load stage at the output of said electronic interface circuit, the load stage being provided with a means for storing electrical charges and with an RF emitter provided for emitting an RF signal according to the filling of said means for storing electrical charges,
wherein said electronic interface circuit comprises:
an AC/DC converter for converting an input signal between a first terminal and a second terminal connected at the output of said harvesting stage, and producing a DC signal at the input of the load stage, the converter being provided with a rectifier for producing a rectified signal to said means for storing electrical charges,
a first switch, arranged between the first terminal and the second terminal and capable of alternately connecting or disconnecting the first terminal and the second terminal from one another, the closed or open state of the first switch being governed by a first command signal,
a second switch, disposed between an output of the rectifier and the load stage and capable of alternately connecting or disconnecting the output of the rectifier from said load stage, the open or closed state of the second switch being governed by a second command signal,
the electronic interface circuit being further provided with a logic control block configured to produce said first command signal and said second command signal, the control block being capable of alternately switching said switches from a first configuration to a second configuration and from the second to the first configuration,
the first configuration being a configuration wherein the first switch is open and the second switch is closed, so that said first terminal and said second terminal are disconnected and the output of said rectifier is connected to said means for storing electrical charges,
the second configuration being a configuration wherein the first switch is closed and the second switch is open so as to disconnect the output of the rectifier from said load stage and connect the first terminal and the second terminal to each other,
said logic control block being further configured, in a given operating mode of said circuit, to trigger an alternation between said first configuration and said second configuration several times.

16. An electronic interface circuit for electromagnetic energy harvesting, to be disposed between an electromagnetic energy harvesting stage and a load stage, the electromagnetic energy harvesting stage having an equivalent electrical circuit provided in series with an alternating voltage generator, an inductance L and an output impedance, the generator producing an alternating AC signal resulting from a conversion of mechanical energy into electromagnetic energy, the load stage being provided with a means for storing electrical charges, particularly a capacitance,
said electronic interface circuit comprising:
an AC/DC converter for converting an input signal between a first terminal and a second terminal connected at the output of said harvesting stage, and producing a DC signal at the input of the load stage, the converter being provided with a rectifier for producing a rectified signal to said means for storing electrical charges,
a first switch, arranged between the first terminal and the second terminal and capable of alternately connecting or disconnecting the first terminal and the second terminal from one another, the closed or open state of the first switch being governed by a first command signal,
a second switch, disposed between an output of the rectifier and the load stage and capable of alternately connecting or disconnecting the output of the rectifier from said load stage, the open or closed state of the second switch being governed by a second command signal,
the electronic interface circuit being further provided with a logic control block configured to produce said first command signal and said second command signal, the control block being capable of alternately switching said switches from a first configuration to a second configuration and from the second to the first configuration,
the first configuration being a configuration wherein the first switch is open and the second switch is closed, so that said first terminal and said second terminal are disconnected and the output of said rectifier is connected to said means for storing electrical charges,
the second configuration being a configuration wherein the first switch is closed and the second switch is open so as to disconnect the output of the rectifier from said load stage and connect the first terminal and the second terminal to each other,
said logic control block being further configured, in first operating mode of said circuit, to trigger said first configuration,
said logic control block being further configured, in a second operating mode of said circuit, to trigger an alternation between said first configuration and said second configuration several times,
said logic control block being further configured, to trigger a transition from said first operating mode to said second operating mode when an output voltage across said means for storing electrical charges exceeds a threshold value.

* * * * *